(12) United States Patent
Fukumoto et al.

(10) Patent No.: US 11,143,964 B2
(45) Date of Patent: Oct. 12, 2021

(54) SUBSTRATE TREATING METHOD AND APPARATUS USED THEREFOR

(71) Applicant: SCREEN Holdings Co., Ltd., Kyoto (JP)

(72) Inventors: Yasuhiro Fukumoto, Kyoto (JP); Yuji Tanaka, Kyoto (JP); Takeharu Ishii, Kyoto (JP); Tomohiro Matsuo, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/871,105

(22) Filed: May 11, 2020

(65) Prior Publication Data

US 2020/0272055 A1 Aug. 27, 2020

Related U.S. Application Data

(62) Division of application No. 15/856,486, filed on Dec. 28, 2017, now abandoned.

(30) Foreign Application Priority Data

Feb. 14, 2017 (JP) .............................. JP2017-025229

(51) Int. Cl.
*G03F 7/40* (2006.01)
*G03F 7/00* (2006.01)

(52) U.S. Cl.
CPC .............. *G03F 7/40* (2013.01); *G03F 7/0002* (2013.01)

(58) Field of Classification Search
CPC ......... G03F 7/40; G03F 7/0002; H01L 21/02; H01L 21/67109; H01L 21/324;

(Continued)

(56) References Cited

U.S. PATENT DOCUMENTS 6,354,832 B1 * 3/2002 Yoshimura ........ H01L 21/67109
118/725
6,656,273 B1 * 12/2003 Toshima ............. H01L 21/6715
118/56

(Continued)

FOREIGN PATENT DOCUMENTS

JP  H10-223515 A  8/1998
JP  2000-040698 A  2/2000

(Continued)

OTHER PUBLICATIONS

Office Action dated Oct. 13, 2018 in corresponding Taiwan Patent Application No. 107100412.

(Continued)

*Primary Examiner* — Edward Chin
(74) *Attorney, Agent, or Firm* — Ostrolenk Faber LLP

(57) ABSTRACT

A substrate treating method for performing a heat treatment of a substrate that has a treated film formed thereon in a heat treating space of a heat treating chamber. The method includes an exhaust step of exhausting gas within the heat treating space formed by a cover enclosing surroundings of a heat treating plate; an inert gas supply step of supplying inert gas from an upper portion of the heat treating space into the heat treating space and supplying inert gas into a gap between an outer peripheral surface of the heat treating plate and an inner wall of the cover; and a heat treating step of performing the heat treatment of the substrate in the heat treating space. The heat treating step is performed after the exhaust step and the inert gas supply step.

4 Claims, 3 Drawing Sheets

(58) Field of Classification Search
CPC ......... H01L 21/02312; H01L 21/67098; H01L 21/67017
See application file for complete search history.

(56) References Cited

U.S. PATENT DOCUMENTS

| | | | |
|---|---|---|---|
| 10,047,441 B2 | 8/2018 | Harumoto et al. | |
| 2007/0128889 A1 | 6/2007 | Goto et al. .................... | 438/795 |
| 2014/0022521 A1* | 1/2014 | Harumoto ........... | C23C 16/0227 355/27 |
| 2014/0273290 A1* | 9/2014 | Somervell ............ | G03F 7/0002 438/5 |
| 2016/0068430 A1 | 3/2016 | Suenaga et al. | |

FOREIGN PATENT DOCUMENTS

| | | | |
|---|---|---|---|
| JP | 2000040698 A | * | 2/2000 |
| JP | 2004-186709 A | | 7/2004 |
| JP | 2004186709 A | * | 7/2004 |
| JP | 2007-158077 A | | 6/2007 |
| JP | 2007-201077 A | | 8/2007 |
| JP | 2007201077 A | * | 8/2007 |
| JP | 2012-174820 A | | 9/2012 |
| JP | 2013004804 A | * | 1/2013 |
| JP | 2014-0022570 A | | 2/2014 |
| JP | 2013-004804 A | | 9/2014 |
| JP | 2016-058585 A | | 4/2016 |
| KR | 10-2014-0011262 A | | 1/2014 |

OTHER PUBLICATIONS

Office Action dated Aug. 24, 2019 in corresponding Korean Patent Application No. 10-2018-0010729.
Office Action dated Oct. 20, 2020 for corresponding Japanese Patent Application No. 2017-025229.
Office Action dated Feb. 24, 2021 for corresponding Japanese Patent Application No. 2017-025229.

* cited by examiner

SUBSTRATE TREATING METHOD AND APPARATUS USED THEREFOR

CROSS-REFERENCE TO RELATED APPLICATION

The present application is a divisional of U.S. patent application Ser. No. 15/856,486, filed Dec. 28, 2017, which claims priority to Japanese Patent Application No. 2017-025229, filed Feb. 14, 2017, the contents of all of which are incorporated herein by reference.

BACKGROUND OF THE INVENTION

(1) Field of the Invention

The present invention relates to a substrate treating method and an apparatus used therefor for performing a heat treatment of a semiconductor wafer, a substrate for liquid crystal display, a substrate for flat panel display (FPD) like a substrate for organic electroluminescence (EL), a substrate for optical display, a magnetic disk substrate, an optical magnetic disk substrate, a substrate for photomask, and a solar cell substrate (hereinafter, simply referred to as a substrate).

(2) Description of the Related Art

In recent process technologies, attention has been focused on a DSA process, for example, as a technology instead of immersion lithography or extreme ultraviolet (EUV) lithography. The DSA process is performed with a directed self-assembly (DSA) technology using micro phase separation of a block co-polymer for achieving much finer design rules on substrates.

In the currently-used substrate treating method in the DSA process, a block co-polymer (BCP) is applied to a substrate for deposition of a treated film, and thereafter, a heat treatment of heating the treated film on the substrate is performed in a heat treating space of a heat treating chamber, whereby (phase) separation of two types of polymers in the treated film is performed. Then, etching is performed to one of the (phase) separated polymers, whereby fine patterns are formed. See, for example, Japanese Unexamined Patent Publication No. 2014-22570A.

However, the example of the currently-used apparatus with such a configuration has the following problems.

Specifically, in the currently-used method, such a problem may arise as the polymer in the treated film is not able to be separated appropriately depending on a treatment atmosphere in the heat treating space. Moreover, the deposited film may pose some difficulty in its property and performance depending on a treatment atmosphere in the heat treating space also during a process of performing heat treatment of the substrate within the heat treating chamber other than the DSA process, the process including process of depositing a film by a heat treatment after a spin on glass (SOG) solution is applied to the substrate.

SUMMARY OF THE INVENTION

The present invention has been made regarding the state of the art noted above, and its one object is to provide a substrate treating method and an apparatus used therefor that allow appropriate film deposition by producing a suitable treatment atmosphere in a heat treating space in a heat treating process.

To fulfill the above object, Inventors of the present invention have made intensive research and attained the following findings. Attention was focused on an influence of oxygen in a heat treating space in view of a relationship between various parameters of the heat treating space and a separated condition of a polymer after a heat treatment under different treatment atmospheres in the heat treating space of the heat treating chamber. Such attention was made based on the finding that inappropriate phase separation of the polymers was performed during the heat treatment where an oxygen concentration in the heat treating space was lowered incompletely. Now, it is estimated that, if the oxygen concentration is lowered incompletely, the polymer is adversely affected during phase separation thereof, and accordingly normal phase separation is inhibited. Also in heat treatment processes other than the DSA process, oxidation caused by oxygen adversely affects a property of film deposition. The present invention based on such finding as above is constituted as under.

One aspect of the present invention provides a substrate treating method for performing a heat treatment of a substrate having a treated film formed thereon in a heat treating space of a heat treating chamber. The method includes an exhaust step of exhausting gas within the heat treating space formed by a cover enclosing surroundings of a heat treating plate; an inert gas supply step of supplying inert gas into the heat treating space from an upper portion of the heat treating space and supplying inert gas into a gap between an outer peripheral surface of the heat treating plate and an inner wall of the cover; and a heat treating step of performing the heat treatment of the substrate in the heat treating space, the heat treating step being performed after the exhaust step and the inert gas supply step.

With the aspect of the present invention, the exhaust step is performed to exhaust the gas within the heat treating space. The inert gas supply step is performed to supply the inert gas from the upper portion of the heat treating space, and to supply the inert gas into the gap between the outer peripheral surface of the heat treating plate and the inner wall of the cover. The gap between the outer peripheral surface of the heat treating plate and the inner wall of the cover is narrow, and oxygen stagnated in the gap is not able to be replaced sufficiently only with the supply of the inert gas from the upper portion of the heat treating space. Accordingly, the inert gas is also supplied to the gap. Consequently, the oxygen stagnated in the gap is able to be replaced by the inert gas, achieving an extremely lowered oxygen concentration in the heat treating space. As a result, the treatment atmosphere within the heat treating space during the heat treating step is able to be made suitable for the heat treating process, leading to appropriate film deposition.

Moreover, it is preferred in the aspect of the present invention that, the heat treating step is performed while exhaust from through holes into which support pins moving forward/backward from the heat treating plate are inserted is only performed and exhaust from an exhaust port of the cover stops.

The exhaust from the through holes located adjacent to a lower surface of the substrate is only performed, achieving stable airflow in the heat treatment atmosphere around a top face of the substrate.

Consequently, a heat treatment of a treated film is performable in a stable manner.

Moreover, it is preferred in the aspect of the present invention that the treated film is made from a directed self-assembly material.

This makes the treatment atmosphere in the heat treating space suitable for the DSA process, achieving appropriate separation of the polymer.

Another aspect of the present invention provides a substrate treating apparatus for performing a heat treatment of a substrate having a treated film formed thereon in a heat treating space. The apparatus includes a heat treating plate where the substrate to be treated is placed; a cover that is erected outwardly from an outer peripheral surface of the heat treating plate by a gap, and encloses surroundings of the heat treating plate to form a heat treating space inside thereof; an upper inert gas supplying device that supplies inert gas from an upper portion of the heat treating space into the heat treating space; openings formed in the cover in communication with the gap; a lower inert gas supplying device that supplies inert gas into the openings; an exhaust device that exhausts gas within the heat treating space; and a controller that causes the exhaust device to exhaust the gas within the heat treating space, and causes the upper inert gas supplying device and the lower inert gas supplying device to supply the inert gas, and thereafter performs the heat treatment of the substrate placed on the heat treating plate.

With the aspect of the present invention, the controller causes the exhaust device to exhaust the gas within the heat treating space, and causes the upper inert gas supplying device and the lower inert gas supplying device to supply the inert gas. The inert gas is supplied from the upper portion of the heat treating space and the openings in communication with the gap between the outer peripheral surface of the heat treating plate and the cover. Accordingly, oxygen stagnated in the gap is able to be replaced by the inert gas, achieving an extremely lowered oxygen concentration in the heat treating space. As a result, the treatment atmosphere within the heat treating space during the heat treating step is able to be made suitable for the heat treating process, leading to appropriate film deposition.

Moreover, it is preferred in the embodiment of the present invention that the cover includes the openings formed therein at two positions that are opposite to each other across the center of the heat treating plate in plan view.

Since the inert gas is supplied from the openings at the two positions opposite to each other, an enough amount of the inert gas is able to be supplied to the entire periphery of the gap in contrast to a situation where the inert gas is supplied from one position. Consequently, oxygen stagnated into the gap is able to be replaced sufficiently by the inert gas.

Moreover, it is preferred in the aspect of the present invention that the heat treating plate includes through holes into which support pins for delivering the substrate are inserted in communication with the heat treating space, the cover includes an exhaust port in communication with the heat treating space, the exhaust device performs exhaust from the through holes and exhaust from the exhaust port, and the controller performs the heat treatment of the substrate while causing the exhaust device to stop the exhaust from the exhaust port and to perform only the exhaust from the through holes.

The controller performs the heat treatment of the substrate while causing the exhaust device to stop the exhaust from the exhaust port and to perform the exhaust from only the through holes. The exhaust is performed only from the through holes adjacent to the lower surface of the substrate, leading to stable airflow in the heat treatment atmosphere around the top face of the substrate. Consequently, the heat treatment of the treated film is able to be performed in a stable manner.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The following describes one embodiment of the present invention with reference to drawings.

Figure 1:
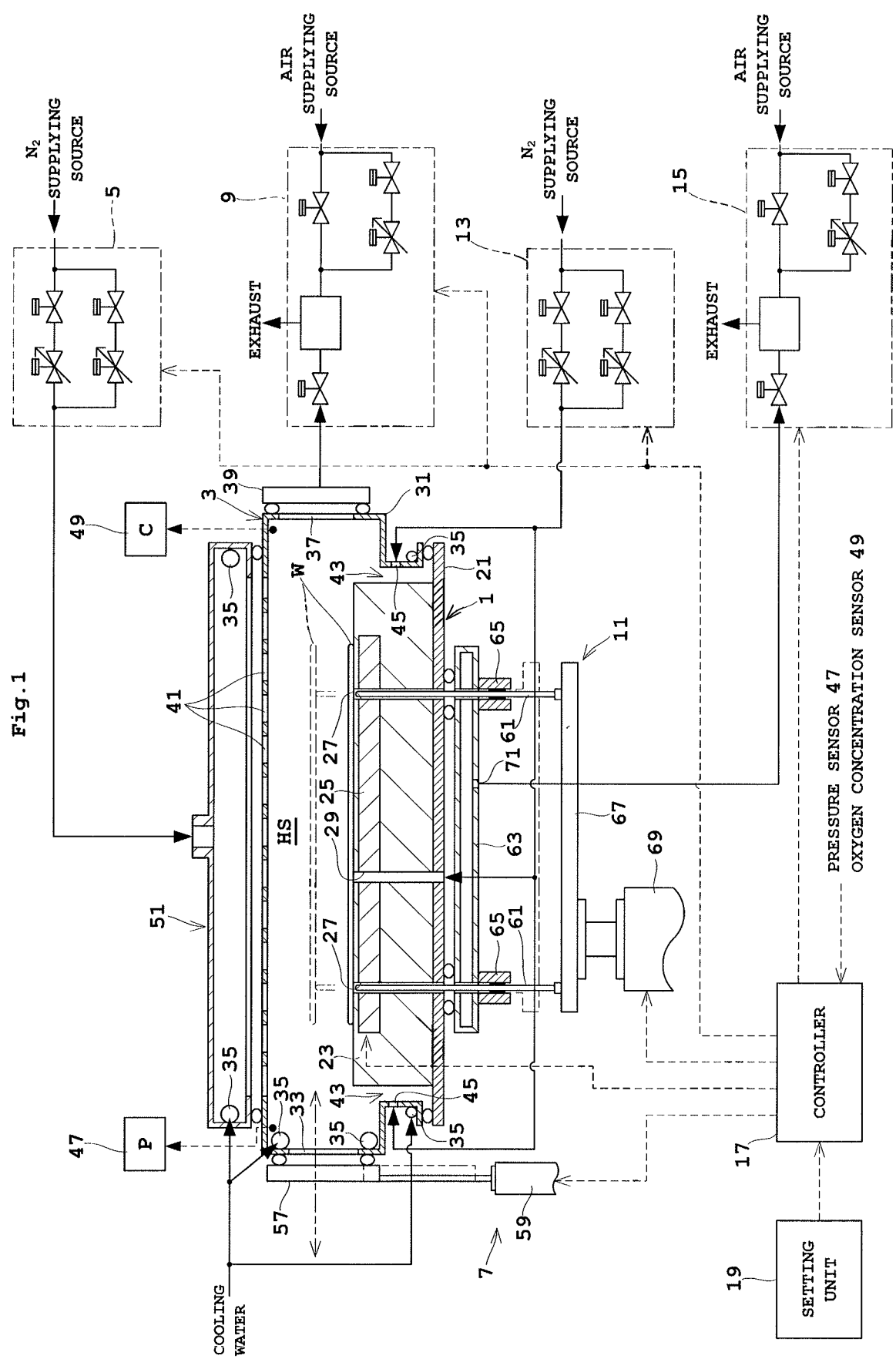
FIG. 1 schematically illustrates an overall configuration of a substrate treating apparatus according to one embodiment of the present invention.
Figure 2:
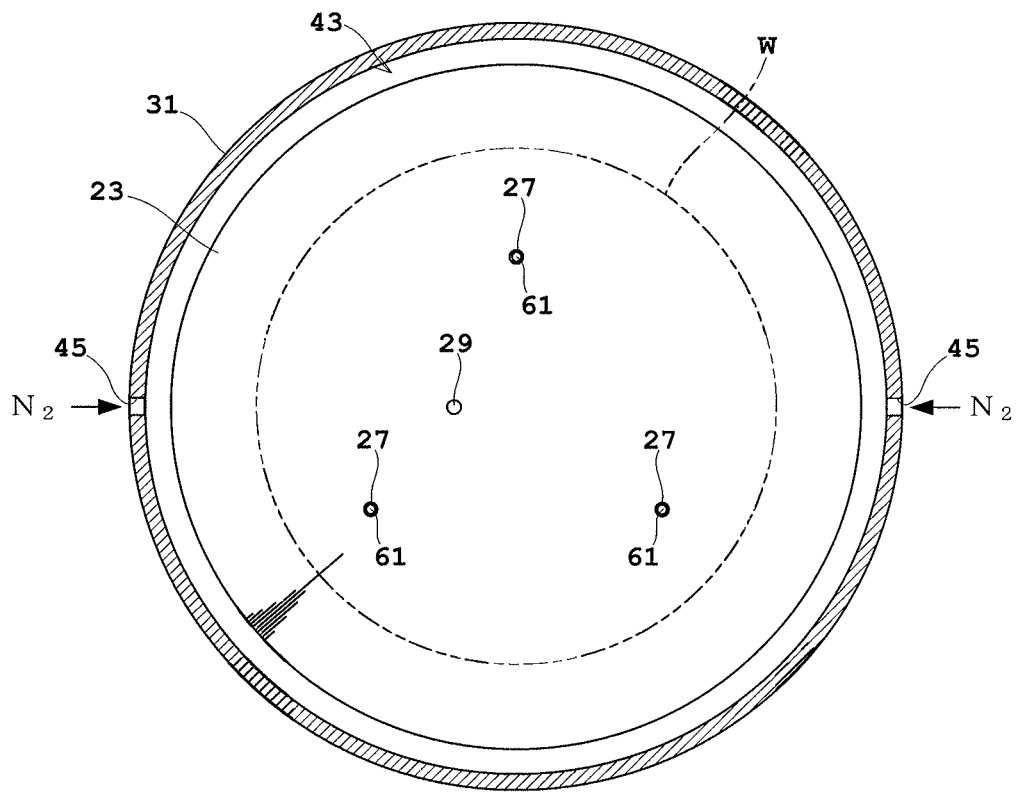
FIG. 2 is a plan view around a heat treating plate.
Figure 3:
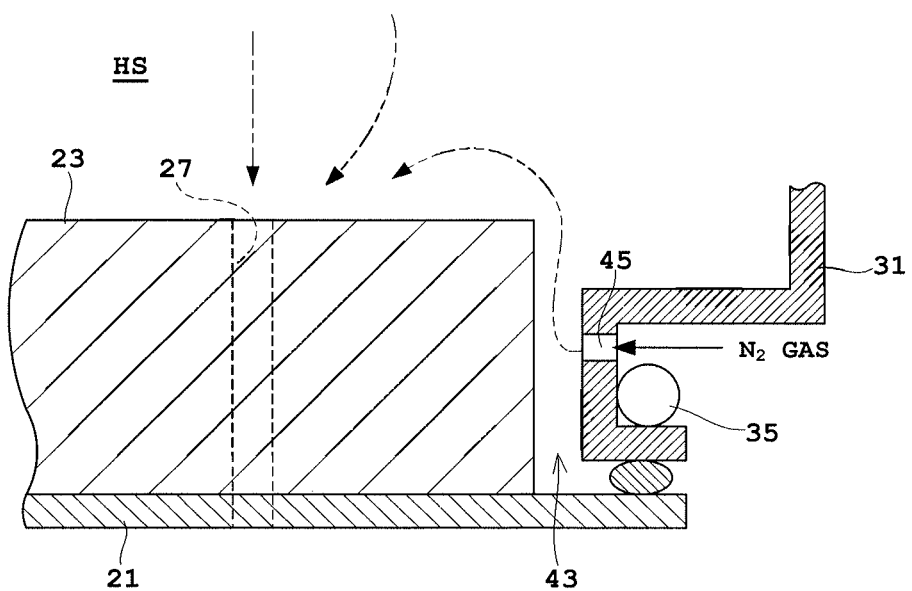
FIG. 3 is a longitudinal sectional view around the heat treating plate.

FIG. 1 schematically illustrates an overall configuration of a substrate treating apparatus according to one embodiment of the present invention. FIG. 2 is a plan view around a heat treating plate, and FIG. 3 is a longitudinal sectional view around the heat treating plate.

The substrate treating apparatus according to the present embodiment for executing a substrate treating method is used for performing a heat treatment of a substrate W. Examples of the substrate W in the present embodiment include one having a treated film made from a directed self-assembly material deposited on a front face thereof.

The substrate treating apparatus according to the present embodiment includes a heat treatment plate unit 1, a heat treating chamber 3, an upper gas supply unit 5, a shutter 7, a chamber exhaust unit 9, a support pin lifting member 11, a lower gas supply unit 13, a support pin seal exhaust unit 15, a controller 17, and a setting unit 19.

The heat treatment plate unit 1 places the substrate W on its top face for performing a heat treatment of the substrate W. The heat treatment plate unit 1 includes a base plate 21, a heat treating plate 23, and a heater 25. The base plate 21 is attached to a lower part of the heat treating plate 23, and is also attached to a lower part of the heat treating chamber 3 together with the heat treating plate 23. The heat treating plate 23 is composed of a material whose base material is a metal, such as copper (Cu) and aluminum (Al), with a high thermal conductivity. The heater 25 is embedded in the heat treating plate 23, and controls a temperature of the heat treating plate 23. For instance, the heater 25 controls a temperature of the heat treating plate 23 within a range of 300 to 400° C. The heat treating plate 23 has proximity balls, not shown, embedded in its top face for locating a rear face of the substrate W away from a top face of the heat treating plate 23 by a given interval (e.g., 0.1 mm).

As illustrated in FIG. 2, the heat treating plate 23 has through holes 27 formed at positions corresponding to vertexes of a regular triangle in plan view. The through holes 27 each pass from the top face to the rear face of the heat treating plate 23, and also pass through the base plate 21. Holder pins mentioned later are inserted into the through holes 27, respectively. Moreover, a topside plate supply port 29 passing the heat treating plate 23 and the base plate 21 in a vertical direction is formed around the center of the heat treating plate 23.

The heat treating chamber 3 includes a cover 31. The cover 31 includes an opening at a lower portion thereof, and the heat treatment plate unit 1 is attached to the opening. The cover 31 shows a shape that covers a lateral side and an upper side of the heat treatment plate unit 1. A space is formed between the ceiling of the cover 31 and the top face of the heat treating plate 23. The space corresponds to a heat treating space HS. The cover 31 has a load outlet 33 formed on a first side face thereof. The load outlet 33 is used for loading a substrate W to be treated into the heat treating space HS and unloading the treated substrate W from the heat treating space HS. A cooling pipe 35 is attached around the load outlet 33. The cooling pipe 35 cools the cover 31 with cooling water supplied thereto, and protects an O-ring around the load outlet 33.

The cover 31 has an exhaust port 37 formed on a second side face thereof, which is opposite to the load outlet 33. The exhaust port 37 is used for exhausting gas within the cover 31. The exhaust port 37 has a flow path sectional area corresponding to a vertical sectional area of the heat treating space HS. An exhaust port cover 39 is removably attached to the outside of the exhaust port 37 via the O-ring. The ceiling of the cover 31 includes a plurality of through holes 41. An annular gap 43 in plan view is present between the heat treatment plate unit 1 and an outer peripheral surface of the heat treating plate 23 of the cover 31 around the heat treatment plate unit 1. A side face of the cover 31 facing to the gap 43 has openings 45 each in communication with the gap 43. The openings 45 are, for example, formed at two positions opposite to each other across the center of the heat treating plate 23 in plan view as in FIG. 2. The cooling pipe 35 is disposed at an outer face of the cover 31 below the openings 45 as in FIGS. 1 and 3. The cooling pipe 35 protects the O-ring between the cover 31 and the base plate 21. The lower gas supply unit 13 supplies nitrogen gas into the openings 45 and the topside plate supply port 29. The lower gas supply unit 13 includes a plurality of flow rate regulating valves or on-off valves for allowing regulation of a flow rate of the nitrogen gas.

The exhaust port 37 exhausts gas through the exhaust port having the flow path sectional area corresponding to the vertical sectional area of the heat treating space HS, leading to efficient exhaust.

Here, the lower gas supply unit 13 corresponds to the "lower inert gas supplying device" in the present invention.

A pressure sensor 47 is disposed above the cover 31 adjacent to the load outlet 33. An oxygen concentration sensor 49 is disposed above the cover 31 adjacent to the exhaust port 37. The pressure sensor 47 determines pressure within the heat treating space HS. The oxygen concentration sensor 49 determines an oxygen concentration within the heat treating space HS. As is described hereunder, it should be noted that the oxygen concentration sensor 49 is only used when an examination to determine lapsed time during which the oxygen concentration is lowered to a target value or less, and accordingly, the oxygen concentration sensor 49 is not necessarily provided during normal treatment.

A gas supply buffer 51 is disposed above the cover 31. Here, nitrogen ($N_2$) gas supplied from the center of the top face of the cover 31 is supplied from an underside opening of the cover 31, having a larger area than the center of the top face, through a plurality of through holes 41 into the heat treating space HS. An O-ring is disposed between the top face of the cover 31 and an under face of the gas supply buffer 51. Another cooling pipe 35 is disposed inside of the gas supply buffer 51. The cooling pipe 35 protects the O-ring. The upper gas supply unit 5 supplies nitrogen gas as inert gas into the gas supply buffer 51 mentioned above. The upper gas supply unit 5 includes two flow rate regulating valves, for example, that allow switch of a flow rate of the nitrogen gas in two steps.

Here, the gas supply buffer 51 corresponds to the "upper inert gas supplying device" in the present invention.

The shutter 7 is disposed on a front face of the load outlet 33. The shutter 7 includes the load outlet 33, a shutter body 57, and an actuator 59. The shutter body 57 is lifted by the actuator 59 whose actuating pieces move upwardly/downwardly in a vertical direction. The shutter body 57 closes the load outlet 33 via the O-ring when moving upwardly. When the actuator 59 is brought into an actuated state, the shutter body 57 moves to a position denoted by solid lines in FIG. 1 to close the load outlet 33. When the actuator 59 is brought into a non-actuated state, the shutter body 57 moves downwardly to a position denoted by chain double-dashed lines in FIG. 1 to open the load outlet 33.

The chamber exhaust unit 9 exhausts gas within the heat treating space HS via the exhaust port cover 39 mentioned above. The chamber exhaust unit 9 includes a plurality of on-off valves, flow rate regulating valves, aspirators, and the like, for exhausting the gas within the heat treating space HS by supplying air from an air supplying source. It should be noted that the chamber exhaust unit 9 may be formed by an exhaust pump and the like instead of the aspirators and the air supplying source.

The support pin lifting member 11 includes three support pins 61 (two of which are only denoted in FIG. 1 for an illustrational reason), a manifold 63, mechanical seals 65, a lifting member 67, and an actuator 69. The support pins 61 are inserted into the through holes 27, respectively. The support pins 61 pass through the manifold 63 and are coupled at lower ends thereof to the lifting member 67 via the mechanical seals 65. An O-ring is attached between the top face of the manifold 63 and the base plate 21 so as to surround each of the through holes 27. Upper ends of the mechanical seals 65 are attached to an under face of the manifold 63. The mechanical seals 65 are metal seals that allow upward/downward movement of the support pins 61 while supporting outer peripheral surfaces of the support pins 61 in a sealing manner. The manifold 63 shows a triangle shape in plan view, and has one space formed therein. The manifold 63 has an exhaust port 71 formed at one region thereof in communication with the space.

The lifting member 67 shows an annular shape in plan view, and is moved upwardly/downwardly by the actuator 69. The actuator 69 is disposed in an attitude where the actuating pieces are moved forward/backward in the vertical direction. When the actuator 69 is brought into an actuated state, the support pins 61 project to move to the delivery position denoted by chain double-dashed lines in FIG. 1. When the actuator 69 is brought into a non-actuated state, the support pins 61 moves to the retracted position denoted by solid lines in FIG. 1. When the support pins 61 move to the retraced position, the substrate W is placed on the top face of the heat treating plate 23.

The support pin seal exhaust unit 15 exhausts gas from an exhaust port 71 of the manifold 63. The support pin seal exhaust unit 15 includes a plurality of on-off valves, flow rate regulating valves, aspirators, and the like for exhausting gas within the heat treating space HS through the manifold 63 and the through holes 27 by supplying air from an air supplying source. In addition, dust generated on the mechanical seals 65 is discharged simultaneously. It should be noted that the support pin seal exhaust unit 15 may be formed by a vacuum pump instead of the aspirators and the air supplying source.

The support pin seal exhaust unit 15 exhausts gas from the through holes 27 that are formed near a position where the substrate W is placed during the heat treatment. This achieves effective reduction in oxygen concentration around the substrate W that may influence film deposition largely during the heat treatment. Moreover, since the dust generated due to slide of the support pins 61 on the mechanical seals 65 is discharged without entering into the heat treating space HS, the substrate W is able to be treated cleanly.

Here, the through holes 27 and the exhaust port 37 correspond to the "exhaust device" in the present invention.

The upper gas supply unit 5, the chamber exhaust unit 9, the lower gas supply unit 13, the support pin seal exhaust unit 15, and the actuators 59, 69 are controlled en bloc by a controller 17. The controller 17 contains a CPU, a memory, and a timer, each of which is not shown. The controller 17 causes the memory, not shown, to store in advance a plurality of recipes that specific procedures of the heat treatment. The setting unit 19 is operated by an operator to select one of the recipes and to provide an instruction for starting treatment or for operation when an alarm is given.

In the present embodiment, the memory not shown stores in advance a chamber exhaust time, a heat treatment shifting time, a heat treating time, a cooling time, and the like, and such time is referred to by the controller 17 as appropriately. The heat treatment shifting time is lapsed time from an exhaust starting time when the oxygen concentration within the heat treating space HS is lowered to the target value or less in the heat treatment, which is to be mentioned later. This time is measured and determined in advance through examinations while the oxygen concentration sensor 49 is provided.

Figure 4:
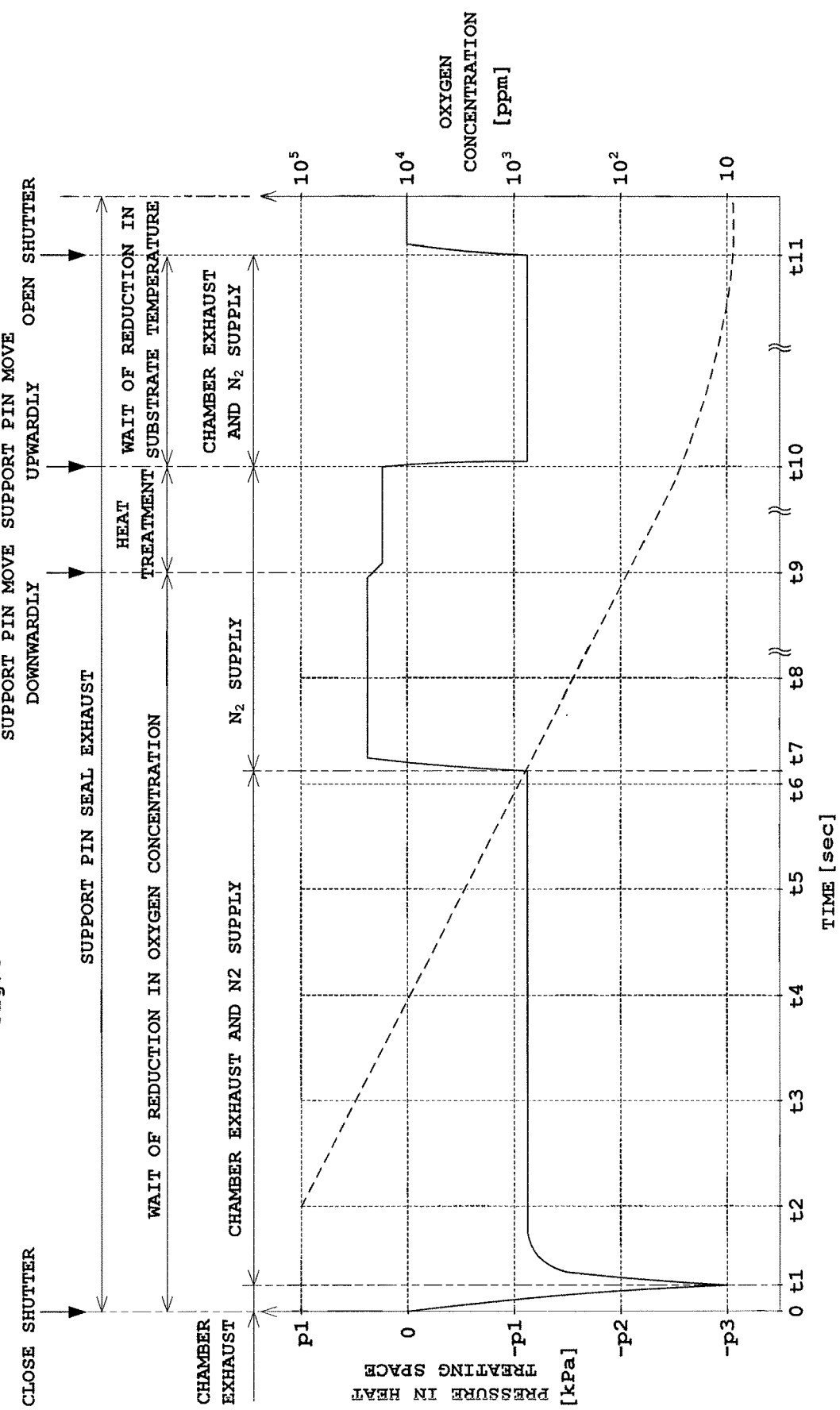
FIG. 4 is a time chart illustrating one example of treating a substrate according to the embodiment.

The following describes one example of the heat treatment by the substrate treating apparatus with reference to FIG. 4. FIG. 4 is a time chart illustrating one example of treating a substrate according to the embodiment. Here, pressure within the heat treating space HS is denoted by solid lines, and an oxygen concentration in the heat treating space HS is denoted by dotted lines in the time chart of FIG. 4.

At time 0, the controller 17 causes the support pin seal exhaust unit 15 to start exhaust from the exhaust port 71, and causes the chamber exhaust unit 9 to start exhaust from the exhaust port 37. Accordingly, gas within the heat treating space HS starts to be exhausted, and pressure is sharply decreased to −p3 kPa at time t1 as the chamber exhaust time. It should be noted that the condition to make the pressure decreased to −p3 kPa at the time t1 as the chamber exhaust time is determined in advance through various examinations of adjusting an exhaust amount from the chamber exhaust unit 9 and the support pin seal exhaust unit 15. Simultaneously, the controller 17 also starts clocking. Such sharp exhaust produces the effect of preventing air from entering from the outside into the heat treating space HS by causing the shutter body 57 to adhere to the O-ring of the load outlet 33 tightly.

After clocking the time t1 as the chamber exhaust time, the controller 17 causes the upper gas supply unit 5 and the lower gas supply unit 13 to start supply of nitrogen gas. Accordingly, pressure within the heat treating space HS moves back sharply to the atmospheric pressure while negative pressure of around −p1 kPa is maintained. This is achieved by making the supply amount of nitrogen gas from the upper gas supply unit 5 and the lower gas supply unit 13 less than the exhaust amount from the chamber exhaust unit 9 and the support pin seal exhaust unit 15. During a period of the time t1 to time t7, the oxygen concentration is lowered through the exhaust and the supply of the nitrogen gas.

During the period of the time t1 to the time t7, the negative pressure is maintained with the exhaust amount larger than the supply amount of the nitrogen gas. The oxygen stagnated at corners within the heat treating chamber 3 and the like is discharged by flow of the nitrogen gas more easily than by flow of the exhaust. Accordingly, this achieves more reduction in oxygen concentration.

The controller 17 causes the chamber exhaust unit 9 to stop at the time t7 corresponding to time after a given period of time from the time 0, and the processing is shifted to exhaust via the through holes 27 (support pin seal exhaust) and reduction in oxygen concentration by purge of supplying nitrogen gas from the upper gas supply unit 5 and the lower gas supply unit 13. This reduces a flow rate of exhaust, leading to variation in pressure of the heat treating space HS toward the atmospheric pressure to maintain the pressurized space.

At this time, oxygen may possibly be stagnated in the gap 43 around the heat treating plate 23. Then, supplying nitrogen gas from the openings 45 leads to exhaust of the stagnated oxygen along with the flow of the nitrogen gas as in FIG. 3. Consequently, an extremely lowered oxygen concentration is obtainable in the heat treating space HS.

When the clocking time has reached the heat treatment shifting time set in advance, the controller 17 causes the support pins 61 to move downwardly to shift the processing to the heat treatment. During the period of time t7 to time t9, chamber exhaust is stopped and exhaust via the through holes 27 (support pin seal exhaust) and supply of the nitrogen gas are performed, leading to flow variation within the heat treating space HS until the time t7. Accordingly, discharge of the oxygen stagnated in the heat treating space HS is obtainable along with the flow variation, achieving a more lowered oxygen concentration.

Here, the period of the time t1 to the time t9 mentioned above corresponds to the "exhaust step" and the "inert gas supply step" in the present invention.

When the time has reached the heat treatment shifting time, the controller 17 causes the actuator 69 to be brought into a non-actuated state, and causes the support pins 61 to move downwardly to the retracted position. Accordingly, the substrate W is placed on the top face of the heat treating plate 23, and the heat treatment of the substrate W is started. The controller 17 starts clocking and maintains this condition until time t10 at which the time reaches the heat treating time. Here, in the time t9, the oxygen concentration in the heat treating space HS is lowered to 100 ppm or less as the target value.

As noted above, the process is able to be shifted to the heat treatment by merely measuring the heat treating time without using any oxygen concentration meter 49. This achieves the simplified configuration of the substrate treating apparatus, leading to reduction in cost needed for the processing.

When the clocking time has reached the heat treating time, the controller 17 causes the actuator 69 to actuate at the time t10 to move the support pins 61 upwardly. Accordingly, the substrate W is moved away from the heat treating plate 23 to the delivery position. The controller 17 causes the chamber exhaust unit 9 to actuate to start exhaust from the exhaust port 37, and to start clocking. This causes cooling of the substrate W.

The period of time t9 to t10 corresponds to the "heat treating step" in the present invention.

When the clocking time reaches the cooling time, the controller 17 causes the chamber exhaust unit 9, the upper gas supply unit 5, and the lower gas supply unit 13 at the time t11 to stop. Then, the actuator 59 is brought into a non-actuation condition, and the shutter body 57 is moved downwardly for unloading the substrate W.

With the aspect of the present embodiment, the gas within the heat treating space HS is exhausted. The nitrogen gas is supplied from the upper portion of the heat treating space HS and from the openings 45 to the gap 43 between the outer peripheral surface of the heat treating plate 23 and the inner wall of the cover 31. The gap 43 between the outer peripheral surface of the heat treating plate 23 and the inner wall of the cover 31 is narrow, and oxygen stagnated in the gap 43 is not able to be replaced sufficiently only with the supply of the inert gas from the upper portion of the heat treating space. Accordingly, the nitrogen gas is also supplied from the openings 45 to the gap 43. Consequently, oxygen stagnated in the gap 43 is also able to be replaced by the nitrogen gas, achieving an extremely lowered oxygen concentration in the heat treating space HS. As a result, the treatment atmosphere within the heat treating space HS is able to be made suitable for the heat treating process, leading to appropriate film deposition.

(1) In the embodiment mentioned above, the substrate W has a treated film coated thereon that is made from a directed self-assembly material. Such a substrate W is not limitative in the present invention. For instance, the present invention is applicable to the treatment that the oxygen concentration in the heat treating space HS adversely affects, such as treatment for a substrate to which a spin on glass (SOG) solution is applied.

(2) In the embodiment mentioned above, the openings 45 are formed at the two positions opposite to each other across the center of the heat treating plate 23 in plan view. However, such is not limitative in the present invention. For instance, the openings 45 may be formed at three or more positions. Alternatively, the openings 45 are not necessarily formed at the position opposite to each other across the center of the heat treating plate 23.

(3) In the embodiment mentioned above, the exhaust from the exhaust port 37 stops in the heat treating step. However, the exhaust from the exhaust port 37 may be successively performed as long as no influence is exerted on the film deposition. This achieves simplified control.

(4) In the embodiment mentioned above, nitrogen gas has been described as one example of the inert gas. However, another type of inert gas such as argon or helium may be used.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for performing a heat treatment of a substrate having a treated film formed thereon in a heat treating space of a heat treating chamber, the substrate treating method comprising:
    an exhaust step of only performing exhausting of gas within the heat treating space without supplying inert gas into the heat treating space, wherein the heat treating space is formed by a cover enclosing surroundings of a heat treating plate;
    an inert gas supply step of supplying inert gas from an upper portion of the heat treating space into the heat treating space, after completion of the exhaust step, and supplying inert gas into a gap between an outer peripheral surface of the heat treating plate and an inner wall of the cover; and
    a heat treating step of performing the heat treatment of the substrate in the heat treating space,
    the heat treating step being performed after the exhaust step and the inert gas supply step,
    wherein the heat treating plate has through holes therein, and the cover has an exhaust port therein, and
    the heat treating step is performed while performing exhaust only from the through holes in the heat treating plate, and not from the exhaust port of the cover.

2. The substrate treating method according to claim 1, wherein
    the treated film is made from a directed self-assembly material.

3. The substrate treating method according to claim 1, wherein
    the treated film is made from a directed self-assembly material.

4. The substrate treating method according to claim 1, wherein the through holes in the heat treating plate are arranged with support pins to be closed/opened by moving the support pins forward/backward into/out of the through holes.

* * * * *